(12) United States Patent
Ma et al.

(10) Patent No.: US 6,933,808 B2
(45) Date of Patent: Aug. 23, 2005

(54) MICROELECTROMECHANICAL APPARATUS AND METHODS FOR SURFACE ACOUSTIC WAVE SWITCHING

(76) Inventors: Qing Ma, 919 Brentwood Dr., San Jose, CA (US) 95129; Dong S. Shim, 5522 Thureson Way, San Jose, CA (US) 95124

( * ) Notice: Subject to any disclaimer, the term of this patent is extended or adjusted under 35 U.S.C. 154(b) by 139 days.

(21) Appl. No.: 10/198,503

(22) Filed: Jul. 17, 2002

(65) Prior Publication Data

US 2004/0012464 A1 Jan. 22, 2004

(51) Int. Cl.[7] .................................................. H03H 9/00
(52) U.S. Cl. ........................ 333/193; 333/194; 333/195; 310/313 R
(58) Field of Search ................................. 333/150–154, 333/193–196; 310/313 R, 313 B, 313 C, 313 D

(56) References Cited

U.S. PATENT DOCUMENTS

| | | | |
|---|---|---|---|
| 3,999,153 A | 12/1976 | Borner | 333/72 |
| 4,155,056 A | 5/1979 | Cross et al. | 333/195 |
| 5,537,083 A * | 7/1996 | Lin et al. | 333/186 |
| 6,307,452 B1 * | 10/2001 | Sun | 333/262 |
| 6,391,675 B1 * | 5/2002 | Ehmke et al. | 438/53 |
| 6,393,913 B1 * | 5/2002 | Dyck et al. | 73/504.12 |
| 6,433,657 B1 * | 8/2002 | Chen | 333/262 |
| 6,516,665 B1 * | 2/2003 | Varadan et al. | 73/504.01 |
| 6,529,093 B2 * | 3/2003 | Ma | 333/101 |
| 6,686,820 B1 | 2/2004 | Ma et al. | 333/262 |
| 2003/0048036 A1 * | 3/2003 | Lemkin | 310/309 |

OTHER PUBLICATIONS

Royer, Daniel, et al., *Elastic Waves in Solids II*, Springer-Verlag Berlin Heidelberg, (2000), pp. 253,257, and 263.
Yao, Z. J., et al., "Micromachined Low–Loss Microwave Switches", *IEEE Journal of Microelectromechanical Systems, vol. 8, No. 2, Jun. 1999*, (Jun. 1999), 129–134.
Liu, Yu, et al., "Mems Capacitive Switch Design", http://mv.ece.ucsb.edu/yorklab/Projects/MEMS/mems cap switch.html. (Jun. 2001).
Muldavin, Jeremy B., et al., "All–Metal High–Isolation Series and Series/Shunt MEMS Switches", *The IEEE Microwave and Wireless Components Letters*, Feb. 15, 2001, (Feb. 15, 2004), 1–3.

\* cited by examiner

*Primary Examiner*—Michael Tokar
*Assistant Examiner*—Khai Nguyen
(74) *Attorney, Agent, or Firm*—Schwegman, Lundberg, Woessner & Kluth, P.A.

(57) ABSTRACT

Microelectromechanical system (MEMS) apparatus and methods for surface acoustic wave (SAW) switching are disclosed. The apparatus includes a piezoelectric substrate having spaced apart input and output SAW transducers. A MEMS switch is arranged between the input and output SAW transducers The MEMS switch has a deformable member in electromagnetic communication with one or more actuation electrodes formed on or above the substrate. The deformable member is deformable to mechanically contact the substrate to deflect or absorb a SAW generated by the input SAW transducer.

29 Claims, 6 Drawing Sheets

MICROELECTROMECHANICAL APPARATUS AND METHODS FOR SURFACE ACOUSTIC WAVE SWITCHING

FIELD OF THE INVENTION

The field of the invention relates to microelectromechanical systems (MEMS), and in particular relates to MEMS apparatus and methods for surface acoustic wave (SAW) switching.

BACKGROUND OF THE INVENTION

Filters and switches are often used in combination in electronic devices. In cell phones for example, radio frequency (RF) signals are detected by an antenna, converted to electrical signals, and then processed. To process the signals, a switch is needed to switch the RF antenna to a filter on the receiving side of the device, or to a filter on the transmission side of the device. In addition, switches are needed to change between frequency channels. In most electronic devices, the switches are in the form of transistors. It is known in the art of electronics that electrical signals suffer from "insertion loss" from passing through switching and filter circuitry.

SAW devices are used in certain electronic applications as resonators and filters. In a SAW filter, an electrical signal is inputted to an input SAW transducer formed on a piezoelectric substrate. The input electrical signal typically has a relatively wide range of frequencies. However, the input SAW transducer creates a SAW having only a narrow range of frequencies. The SAW then travels over the substrate and is detected by an output SAW transducer. The output SAW transducer only responds to a narrow range of SAW frequencies, further enhancing signal filtering. The detected SAW is then converted to an output electrical signal, which has a narrower frequency range than the input electrical signal.

MEMS switches are also used in select electronic applications. One example of a MEMS switch is a capacitor shunt switch, which includes a top electrode in the form of a membrane, and a bottom electrode in the form of a transmission line. In operation, when a direct current (DC) actuation voltage is applied across the top electrode (membrane) and the bottom electrode (transmission line), the membrane is deflected to make physical contact with the dielectric layer of the transmission line. This shorts the circuit to ground, thereby cutting off transmission of signals traveling through the transmission line.

Presently, both MEMS and SAW devices are employed in a variety of electronic devices as resonators, filters and switches. Yet, the general approaches to switching and filtering using SAW and/or MEMS devices involve switching in the electrical domain and filtering in the acoustic domain. This approach tends to be inefficient because of the associated insertion losses. Unfortunately, alternative approaches are currently lacking because of the dearth of efficient acoustic-based switches.

DETAILED DESCRIPTION OF THE INVENTION

In the following detailed description of the embodiments of the invention, reference is made to the accompanying drawings that form a part hereof, and in which is shown by way of illustration specific embodiments in which the invention embodiments may be practiced. These embodiments are described in sufficient detail to enable those skilled in the art to practice them, and it is to be understood that other embodiments may be utilized and that changes may be made without departing from their scope. The following detailed description is, therefore, not to be taken in a limiting sense, and the scope of the embodiments of the present invention is defined only by the appended claims.

Figure 1:
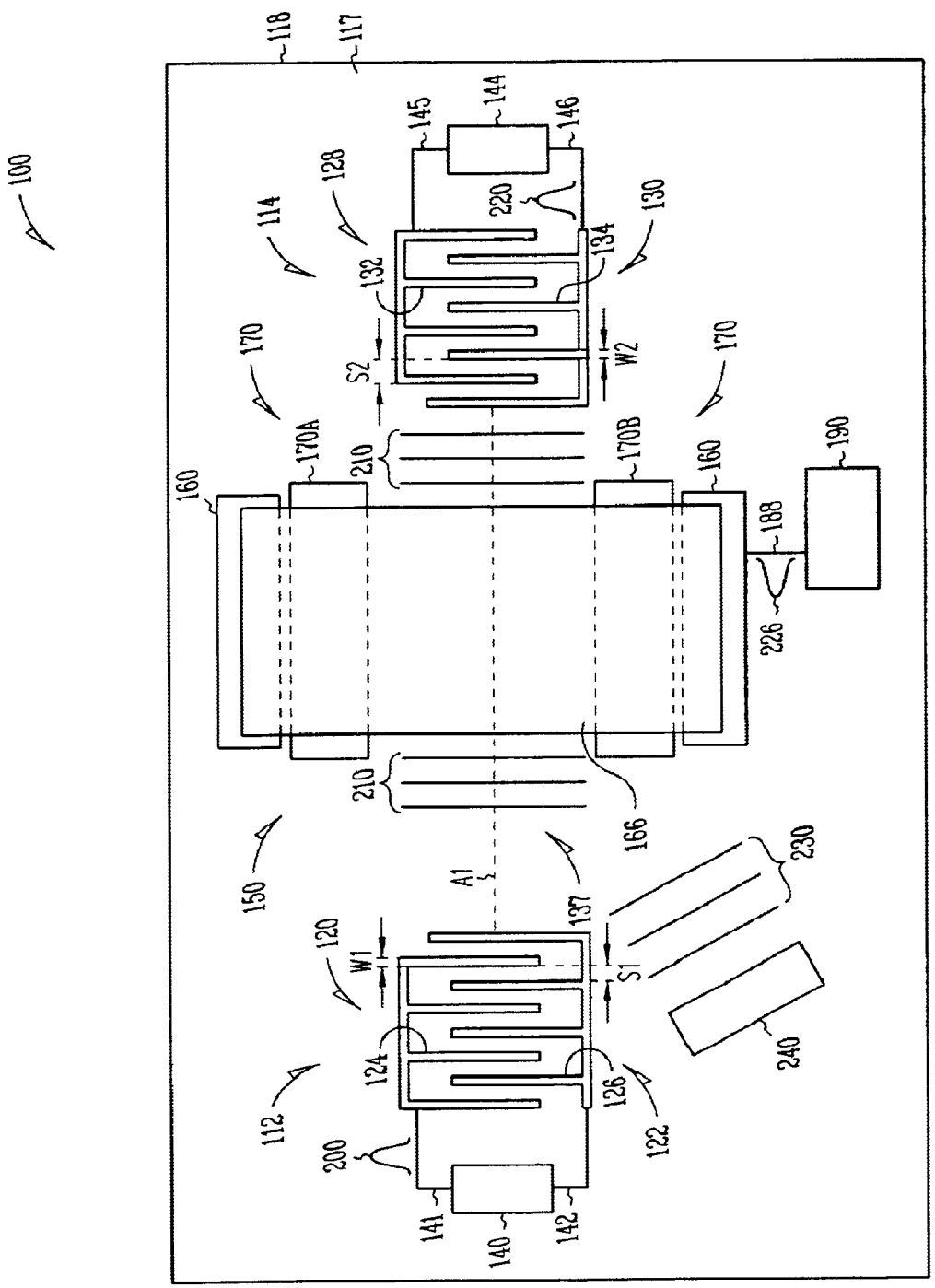
FIG. 1 is a schematic plan view of a generalized example embodiment of a MEMS switching apparatus having an actuation electrodes with two electrode members.

FIG. 1 is a schematic plan view of a generalized example embodiment of a MEMS switching apparatus 100. Apparatus 100 includes an input SAW transducer 112 and an output SAW transducer 114, each formed on or above an upper surface 117 of piezoelectric substrate 118. Input SAW transducer 112 includes first and second sets 120 and 122 of interdigitally arranged electrode fingers 124 and 126. Likewise, output SAW transducer 114 includes first and second sets 128 and 130 of interdigitally arranged electrode fingers 132 and 134.

In an example embodiment, electrode finger sets 120 and 122 are made of a metal film formed using photolithographic and thin film processes, which may include either etching or lift-off techniques. In an example embodiment of input SAW transducer 112, the width W1 of each electrode finger 124 and 126 and the spacing S1 between adjacent electrode fingers is on the micron or submicron level. Likewise in an example embodiment of output SAW transducer 114, the width W2 of each electrode finger 132 and 134 and the spacing S2 between adjacent electrode fingers is on the micron or submicron level.

Input and output SAW transducers 112 and 114 define a SAW path 137 over which a SAW travels. SAW path 137 is defined as the region of substrate surface 117 between the input and output SAW transducers. The width of SAW path 137 is substantially the same as the width of the SAW transducers, so that the SAW path is defined essentially by the size and spacing of the SAW transducers and covers the area between the SAW transducers.

An electrical signal (e.g., voltage) source 140 is coupled to electrode finger sets 120 and 122 of input SAW transducer 112 via wires 141 and 142, and serves to drive the input SAW transducer. In an example embodiment, electrical signal source 140 is an electronic element or device, such as an RF antenna or an amplifier. Further, an electronic element or device 144 is electrically coupled to electrode finger sets 128 and 130 of output SAW transducer 114 via wires 145 and 146. In an example embodiment, electronic element or device 144 is an amplifier (e.g., a low-noise amplifier), an electronic filter, or an analog signal processing chip. Alternatively, electronic device 144 includes some or all of these (or like) elements.

Apparatus 100 further includes a MEMS switch 150 formed on piezoelectric substrate 118 between input SAW transducer 112 and output SAW transducer 114. MEMS switch 150 includes anchors 160 connected to substrate 118 at upper surface 117. Anchors 160 support a deformable member 166 adapted to mechanically contact upper surface 117 within SAW path 137. In an example embodiment, deformable member 166 is a beam. In another example embodiment, deformable member 166 is a membrane.

MEMS switch 150 includes an actuation electrode 170 formed on substrate surface 117. Actuation electrode 170 is arranged so as to be in electromagnetic communication with deformable member 166. In particular, actuation electrode 170 is designed and arranged to electromagnetically engage deformable member 166 with sufficient strength to cause the deformable member to deform and contact substrate upper surface 117 when an electrical signal (e.g., a voltage signal) is applied to the actuation electrode.

Actuation electrode 170 can be made up of one or more electrode elements. For instance, in the example embodiment illustrated in FIG. 1, actuation electrode 170 is made up of two side actuation electrode elements 170A and 170B arranged on upper surface 117 beneath deformable member 166 and adjacent anchors 160. In an example embodiment, electrode elements 170A and 170B lie entirely outside of SAW path 137. In another example embodiment, the electrode elements making up electrode 170 lie at least partially outside of SAW path 137.

Figure 2:
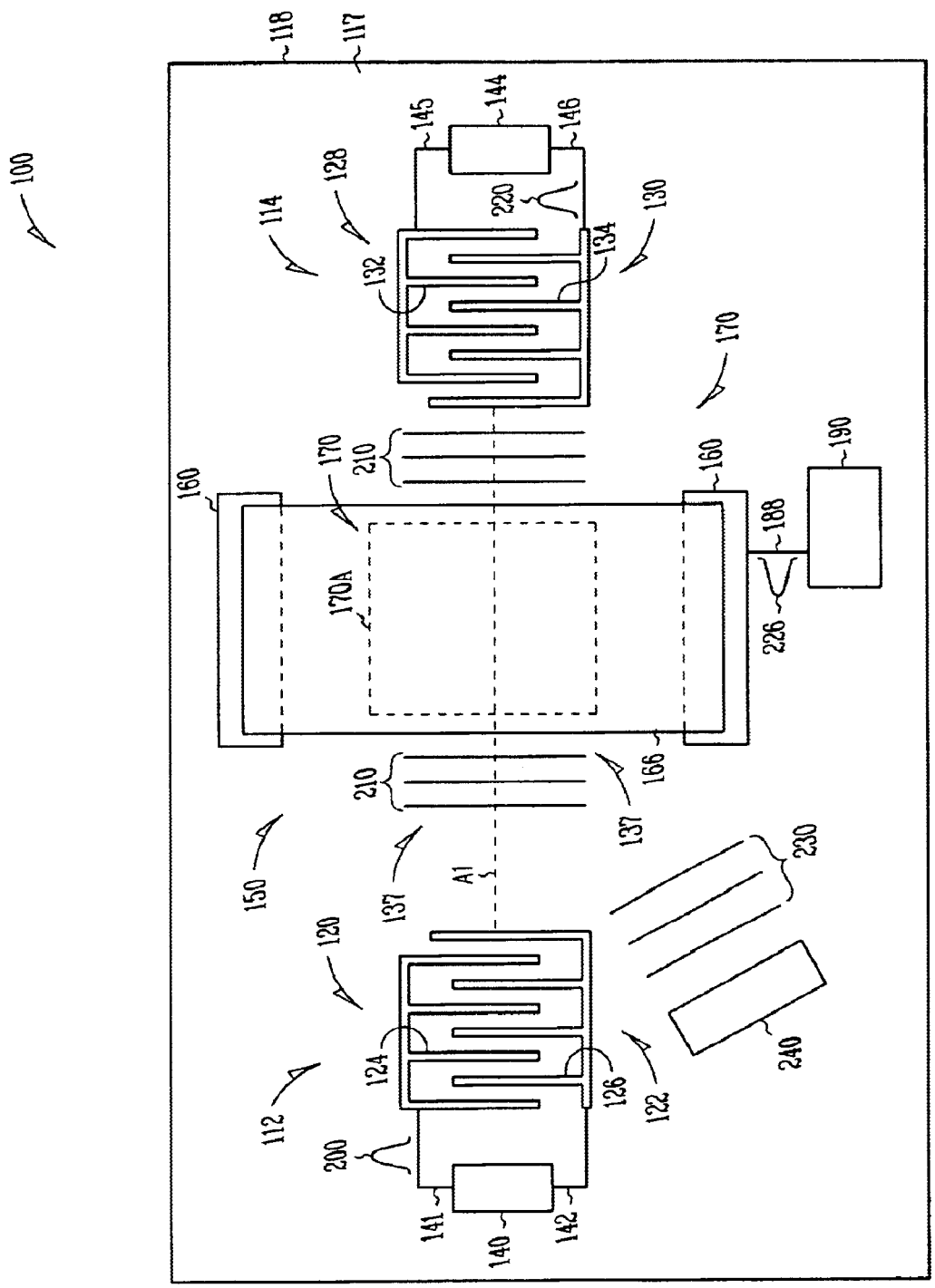
FIG. 2 is a schematic plan view of another generalized example embodiment of a MEMS switching apparatus similar to that of FIG. 1, except that the actuation electrode includes a single electrode member located beneath the deformable member.

In another example embodiment illustrated in FIG. 2, actuation electrode 170 of MEMS switch 150 includes a single electrode member 170A located on substrate upper surface 117 directly beneath deformable member 166 within SAW path 137. Actuation electrode member 170A is conductive, and in example embodiments includes a wear-resistant metal such as Cr, or includes an insulator such as doped diamond. To minimize the loss of SAW energy when passing over the actuation electrode, actuation electrode 170A should be relatively thin and uniform compared to the wavelength of the input SAW 210.

Coupled to MEMS switch 150 and to actuation electrode 170 via a wire 188 is an actuation electrical signal (e.g., voltage) source 190 that periodically actuates (i.e., activates or "turns on") the MEMS switch to deform deformable member 166 so that the deformable member is selectively mechanically contacted with and removed from a portion of substrate upper surface 117 within SAW path 137.

With continuing reference to FIG. 1, apparatus 100 operates as follows. Electrical signal source 140 applies an input electrical signal 200 between sets 120 and 122 of electrode fingers 124 and 126. This creates a periodic strain in piezoelectric substrate 118, thereby creating an input SAW 210 that travels over substrate surface 117 and within SAW path 137. The electrode finger width W1, electrode finger spacing S1, the interdigital pattern of the electrode fingers 124 and 126, and the frequency content of the applied input electrical signal 200 determines the magnitude and phase of input SAW 210. The input SAW propagates across upper surface 117 of substrate 118 to MEMS switch 150.

When MEMS switch 150 is in a first state, deformable member 166 is not in contact with substrate surface 117. This allows SAW 210 to propagate beneath the deformable member and through the MEMS switch without being disturbed. Input SAW 210 continues propagating along substrate surface 117 until it reaches output SAW transducer 114, where it is converted to an output electrical signal 220. Output electrical signal 220 is then further processed by electronic device 144.

When MEMS switch 150 is switched to a second state via an electrical signal 226 from electrical signal source 190, actuation electrode 170 electromagnetically engages and attracts deformable member 166. This causes the deformable member to deform and make contact with substrate upper surface 117. In one embodiment of apparatus 100, deformable member 166 deflects most of or substantially all of input SAW 210, thereby forming a deflected SAW 230. This deflection prevents most of or substantially all of input SAW 210 from reaching output SAW transducer 114.

Further in an example embodiment, deflected SAW 230 is optionally absorbed by an absorbing member 240 residing on or above substrate upper surface 117 and positioned to intercept the deflected SAW. Example materials for absorbing member 240 include silicone and silicone-based materials, such as RTV-3145 available from Dow-Corning, Inc.

In another example embodiment discussed in greater detail below, deformable member 166 includes an absorber layer that absorbs most of or substantially all of input SAW 210, thereby prevents input SAW 210 from reaching output SAW transducer 114.

The selective actuation of MEMS switch 150 causes deformable member 166 to interact with and modify the input SAW 210 in a manner that allows apparatus 100 to operate as an acoustic switch. Several specific example embodiments of the generalized example embodiment of apparatus 100 are now set forth in greater detail below.

MEMS Switch with Grating

Figure 3A:
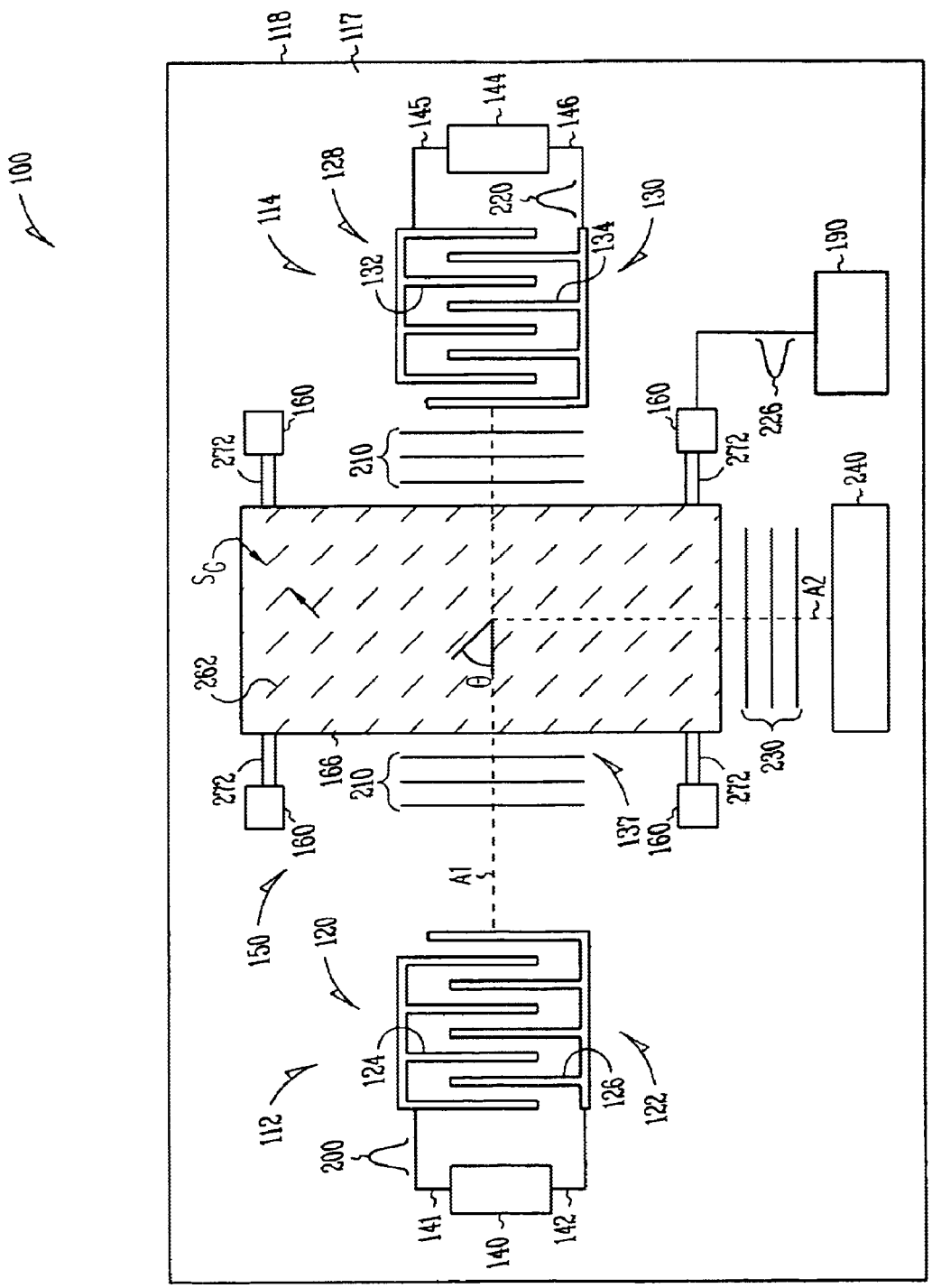
FIG. 3A is a schematic plan view of an example embodiment of the MEMS switching apparatus of FIG. 1, wherein the MEMS switch includes a deformable member with a grating layer.
Figure 3B:
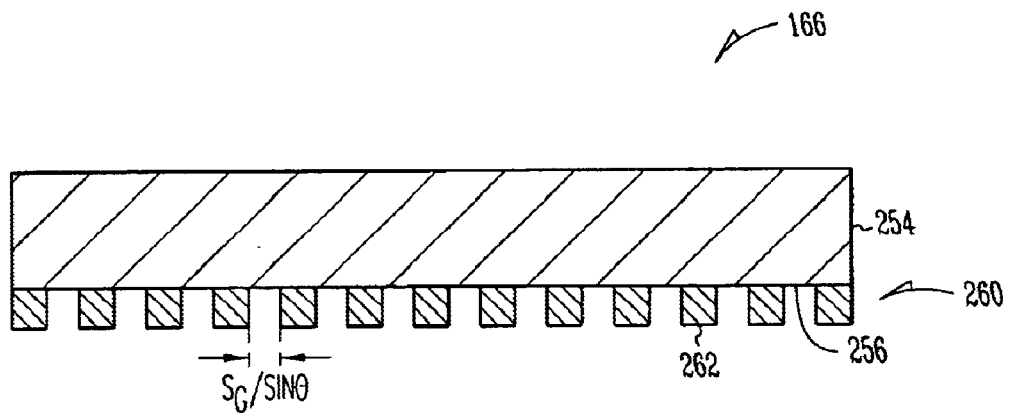
FIG. 3B is a cross-sectional view of the deformable member of the MEMS switch of FIG. 3A, illustrating in more detail the structural layer and the grating layer.

FIG. 3A is a schematic plan view of one example embodiment of the general example embodiment of the MEMS switching apparatus 100 of FIG. 1. FIG. 3B is a cross-sectional view of deformable member 166 of apparatus 100 of FIG. 3A. Deformable member 166 includes in the present example embodiment a structural layer 254 with a lower surface 256. Formed on lower surface 256 is a grating layer 260 having grating lines 262 with a grating spacing $S_G$. Both structural layer 254 and grating layer 260 can be made of a number of materials. In example embodiments, structural layer 254 includes a metal such as Ni, Au, Ti or Al, and grating layer 260 includes a metal, a metal-coated dielectric, nitride, carbide, or an oxide such as $SiO_2$.

In an example embodiment, grating layer 260 is oriented at an angle θ relative to axis A1. This results in input SAW 210 being deflected along an (imaginary) axis A2 that intersects axis A1. In an example embodiment, absorber 240 lies alonaxis A2 to intercept and absorb deflected SAW 230. In an example embodiment, orientation angle θ is such that the deflection of input SAW 210 occurs at a right angle, i.e., such that axis A1 and A2 are at 90 degrees.

The particular grating angle θ needed to achieve a particular deflection direction depends upon the velocities of the input and deflected SAWs 210 and 230. Consider $V_I$ the velocity of incident SAW 210 and $V_D$ the velocity of deflected SAW 230. The velocity $V_D$ may be different from $V_I$ due to anisotropy of piezoelectric crystal substrate 118. The pitch P of grating layer 260 is determined by $P=V_I$ Sin θ/f, where f is the frequency of incident SAW 210. The condition for deflection at a right angle is given by tan θ=$V_I/V_D$. Further in the example embodiment, the number of grating lines and the grating spacing $S_G$ are selected to maximally reflect incident SAW 210.

Figure 3C:
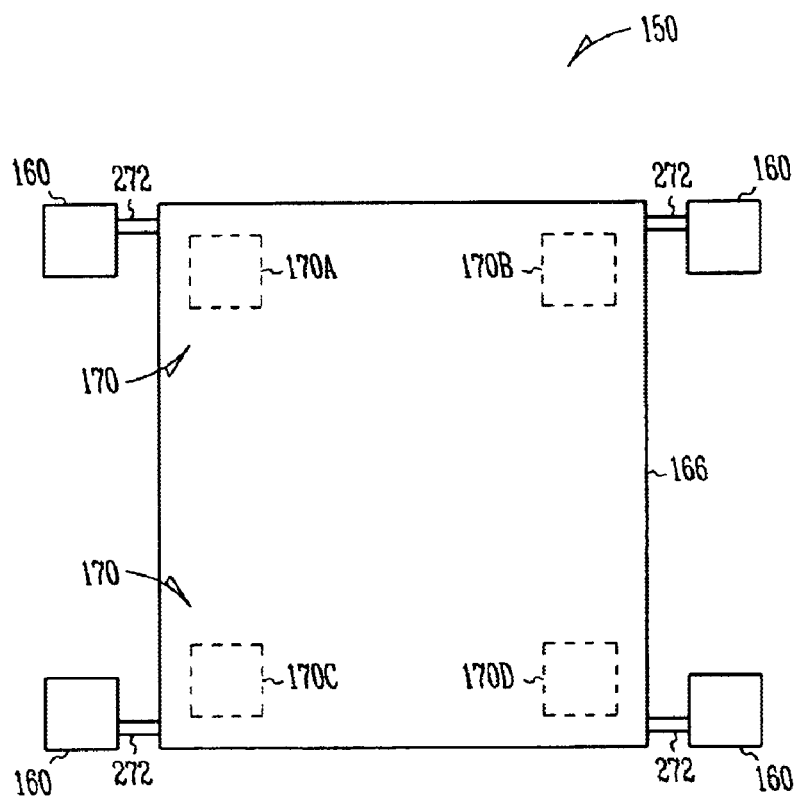
FIG. 3C is a close-up plan view of the MEMS switch of FIG. 3A, illustrating an example embodiment employing four actuation electrodes.

FIG. 3C is close-up plan view of the MEMS switch of FIG. 3A, which includes four anchors 160 with suspension members 272 attached thereto and connected to deformable member 166. In addition, actuation electrode 170 of MEMS switch includes four actuation electrode members 170A, 170B, 170C and 170D on substrate surface 117 arranged beneath deformable member 166 adjacent the deformable member's four corners. This arrangement allows for added flexibility of deformable member 166, while also providing space to accommodate multiple actuation electrodes.

In the operation of MEMS switching apparatus 100 of FIG. 3A, in a first state deformable member 166 is not in contact with substrate upper surface 117. This allows input SAW 210 to propagate directly to output SAW transducer 114. However, when MEMS switch 150 is switched to the second state via electrical signal 226 from actuation electrical signal source 190, actuation electrode members 170A, 170B, 170C and 170D electromagnetically engage deformable member 116, causing the deformable member to deform and make contact with substrate upper surface 117. This allows the grating layer of the deformable member to intercept and deflect most of or substantially all of input SAW 210.

In an example embodiment, deflected SAW 230 is optionally absorbed by absorbing member 240. This deflection and absorption provides the selective isolation of output SAW transducer 114 from input SAW transducer 112 necessary for carrying out a switching operation.

MEMS Switch with Absorber Layer

Figure 4A:
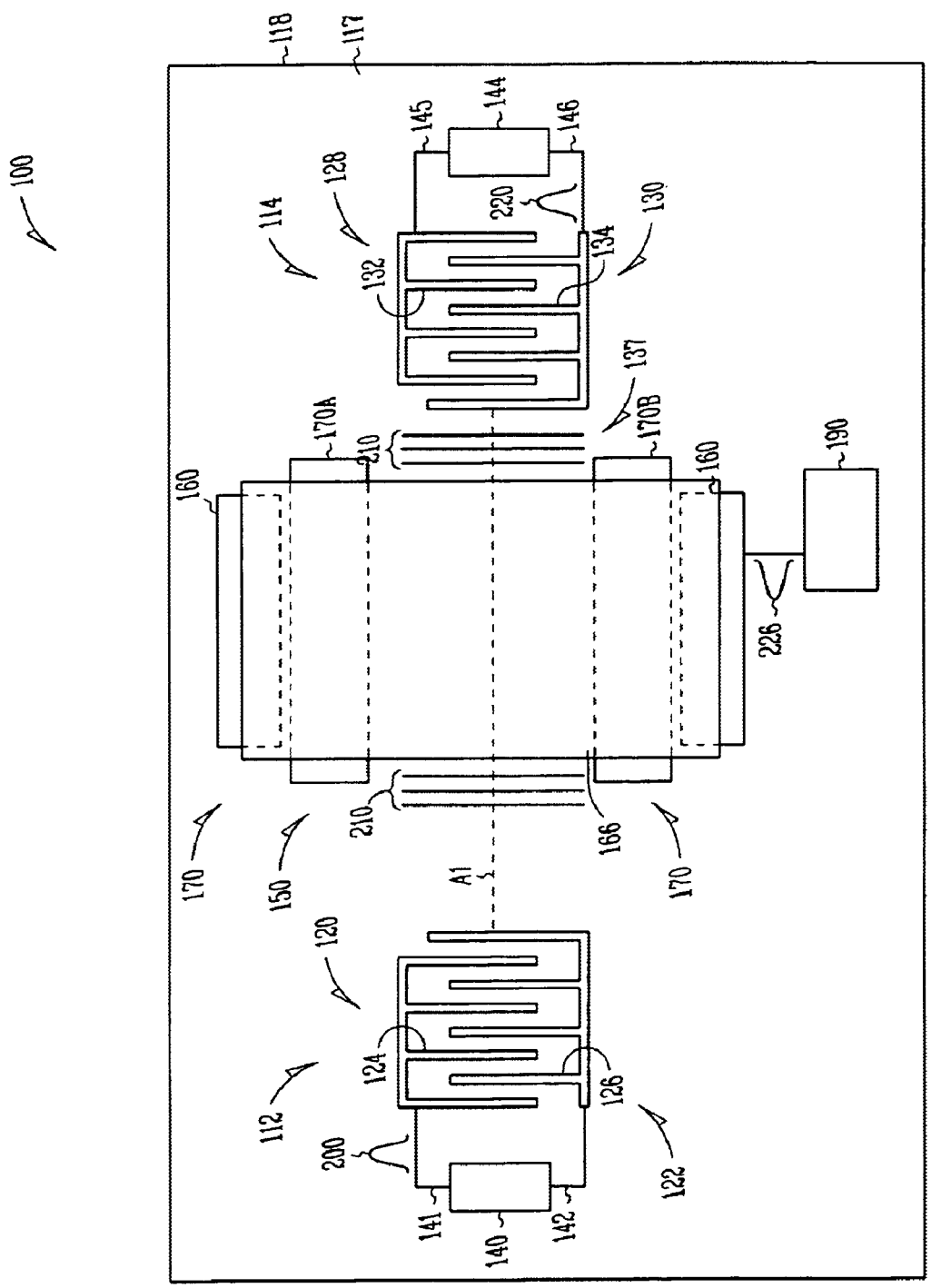
FIG. 4A is a schematic plan view of an example embodiment of the MEMS switching apparatus of FIG. 1, wherein the MEMS switch includes a deformable member with an absorber layer.
Figure 4B:
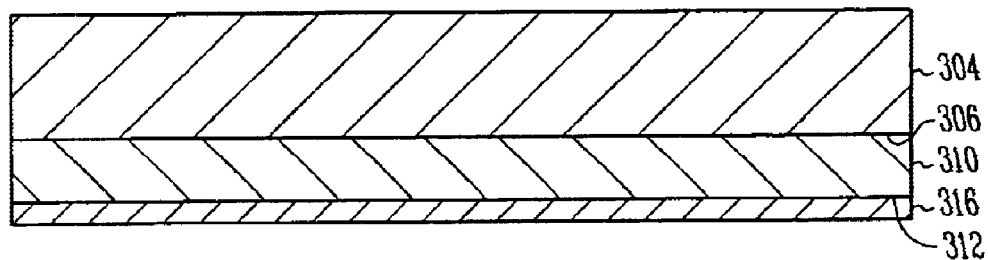
FIG. 4B is a cross-sectional view of the deformable member of the MEMS switch of FIG. 4A, illustrating in more detail the structural layer and the absorber layer.

FIG. 4A is a schematic plan view of another example embodiment of the generalized example MEMS switching apparatus 100 of FIG. 1. FIG. 4B is a close-up cross-sectional view of deformable member 166.

In apparatus 100 of FIG. 4A, deformable member 166 is membranous and includes a structural layer 304 with a lower surface 306, and an absorber layer 310 with a lower surface 312 formed on the structural layer lower surface. Absorber layer 310 is made of a material capable of absorbing a SAW. Example embodiments of absorber layer 310 include a polymer, or a soft metal.

In certain example embodiments, the material making up absorber layer 310 may be capable of damaging or contaminating substrate 118. In such a case, an optional example embodiment includes a thin liner layer 316 formed over lower surface 312 to protect upper surface 117 from damage or contamination from absorber layer 310. Thin liner layer 316 is made of a material compatible with the material making up substrate 118, and in an example embodiment includes the same material as that making up substrate 118.

Further in an example embodiment, substrate upper surface 117 includes an optional thin protective layer (not shown) to protect an underlying electrode or the piezoelectric substrate itself.

In the operation of MEMS switching apparatus 100 of FIG. 4A, when MEMS switch 150 is in the first state, deformable member 166 does not contact substrate upper surface 117. This allows input SAW 210 to propagate directly through MEMS switch 150 and to output SAW transducer 114. However, when MEMS switch 150 is actuated via electrical signal 226 from actuation electrical signal source 190, actuation electrodes 170A and 170B electromagnetically engage deformable member 166, causing it to deform and make mechanical contact with substrate upper surface 117. This allows deformable member 166 to intercept and absorb most of or substantially all of the input SAW in absorber layer 310. This absorption provides the selective isolation of output SAW transducer 114 from input SAW transducer 112 necessary for carrying out switching operation.

While the present invention has been described in connection with preferred embodiments, it will be understood that it is not so limited. On the contrary, it is intended to cover all alternatives, modifications and equivalents as may be included within the spirit and scope of the invention embodiments as defined in the appended claims.

What is claimed is:

1. An apparatus comprising:
 a piezoelectric substrate having spaced apart input and output surface acoustic wave (SAW) transducers; and
 a microelectromechanical system (MEMS) switch arranged between the input and output SAW transducers, the MEMS switch having a deformable member deformable to mechanically contact the substrate to modify a SAW generated by the input SAW transducer.

2. The apparatus of claim 1, wherein the deformable member is adapted to deflect the SAW.

3. The apparatus of claim 2, wherein the deformable member further comprises a grating layer adapted to deflect the SAW.

4. The apparatus of claim 2, further comprising an absorber formed on or above the piezoelectric substrate and arranged to absorb a deflected SAW.

5. The apparatus of claim 1, wherein the deformable member includes an absorber layer adapted to absorb the SAW.

6. The apparatus of claim 1, wherein the apparatus further comprises an actuation electrode arranged to electromagnetically engage the deformable member.

7. The apparatus of claim 6, wherein the actuation electrode is arranged on the substrate surface beneath the deformable member and along an axis connecting the input and output SAW transducers.

8. The apparatus of claim 6, wherein the actuation electrode includes two or more actuation electrode members arrange on the substrate surface beneath the deformable member and at least partially outside of a SAW path defined by the input and output SAW transducers.

9. The apparatus of claim 1, further comprising a first electrical signal source electrically coupled to the input SAW transducer.

10. The apparatus of claim 9, further comprising a second electrical signal source electrically coupled to the MEMS switch.

11. The apparatus of claim 10, further including an electronic device electrically coupled to the output SAW transducer.

12. An apparatus comprising:
 input and output surface acoustic wave (SAW) transducers residing on a surface of a piezoelectric substrate; and
 a microelectromechanical system (MEMS) switch fixed to the substrate between the input and output SAW transducers, the MEMS switch having a deformable member deformable to contact the substrate surface, and an actuation electrode formed on the surface of the substrate and arranged to electromagnetically engage the deformable member.

13. The apparatus of claim 12, further including:
   a first electrical signal source electrically coupled to the input SAW transducer; and
   a second electrical signal source electrically coupled to the MEMS switch.

14. The apparatus of claim 12, wherein the actuation electrode lies within a SAW path defined by the input and output SAW transducers.

15. The apparatus of claim 12, wherein the actuation electrode includes two or more actuation electrode members lying outside a SAW path defined by the input and output SAW transducers.

16. A method comprising:
   generating a first surface acoustic wave (SAW) to travel along a surface of a substrate; and
   selectively modifying the first SAW by contacting a deformable member of a microelectromechanical system (MEMS) switch to the substrate surface.

17. The method of claim 16, including deflecting the first SAW to form a second SAW by contacting a grating formed as part of the deformable member to the substrate surface.

18. The method according to claim 17, including absorbing the second SAW.

19. The method of claim 16, including absorbing the first SAW with an absorber layer formed as part of the deformable member.

20. The method of claim 16, further including actuating the MEMS switch by electromagnetically engaging the deformable member by providing an actuation electrical signal to an actuation electrode residing on the substrate surface and beneath the deformable member in a SAW path defined by the input and output SAW transducers.

21. The method of claim 16, further including actuating the MEMS switch by electromagnetically engaging the deformable member by providing an actuation electrical signal to an actuation electrode having two or more members lying at least partially outside of a SAW path defined by the input and output SAW transducers.

22. The method of claim 16, wherein generating the first SAW includes providing an input electrical signal to an input SAW transducer.

23. The method of claim 16, including detecting the first SAW with an output SAW transducer when the deformable member is not in contact with the substrate.

24. The method of claim 23, including:
   forming an output electrical signal with the output SAW transducer; and
   processing the output electrical signal.

25. A switching method comprising:
   generating an input surface acoustic wave (SAW) on a substrate surface; and
   electromagnetically engaging a deformable member of a microelectromechanical system (MEMS) switch residing on the substrate to cause the deformable member to interact with and modify the input SAW.

26. The switching method of claim 25, wherein modifying the SAW includes one of absorbing and deflecting the input SAW.

27. The switching method of claim 25, wherein generating the input SAW includes providing an input electric signal to an input SAW transducer.

28. The switching method of claim 25, including providing an electrical signal to an actuation electrode to electromagnetically engage and deform the deformable member to cause the deformable member to contact the substrate surface.

29. The switching method of claim 25, including absorbing a deflected SAW.

* * * * *

UNITED STATES PATENT AND TRADEMARK OFFICE
CERTIFICATE OF CORRECTION

PATENT NO. : 6,933,808 B2 Page 1 of 1
DATED : August 23, 2005
INVENTOR(S) : Ma et al.

It is certified that error appears in the above-identified patent and that said Letters Patent is hereby corrected as shown below:

<u>Title page,</u>
Item [56], References Cited, OTHER PUBLICATIONS, "Liu, Yu, et al." reference, delete "Mems" and insert -- MEMS --, therefor; delete "mv" and insert -- my --, therefor; and after "html" delete "." and insert -- , --, therefor.

<u>Column 6,</u>
Line 47, delete "arrange" and insert -- arranged --, therefor.

<u>Column 8,</u>
Line 27, delete "electric" and insert -- electrical --, therefor.

Signed and Sealed this

Twenty-second Day of November, 2005

JON W. DUDAS
*Director of the United States Patent and Trademark Office*